United States Patent [19]
Fujita et al.

[11] Patent Number: 5,416,740
[45] Date of Patent: May 16, 1995

[54] SEMICONDUCTOR MEMORY DEVICE INCLUDING REDUNDANT MEMORY CELL ARRAY FOR REPAIRING DEFECT

[75] Inventors: Koreaki Fujita; Masayuki Yamashita; Masamitsu Shimasaki, all of Hyogo, Japan

[73] Assignee: Mitsubishi Denki Kabushiki Kaisha, Tokyo, Japan

[21] Appl. No.: 987,757

[22] Filed: Dec. 9, 1992

[30] Foreign Application Priority Data

Dec. 12, 1991 [JP] Japan .................. 3-328867

[51] Int. Cl.⁶ ............................................. G11C 7/00
[52] U.S. Cl. ................................. 365/200; 365/201; 365/230.03; 371/10.2
[58] Field of Search ............ 365/200, 201, 230.03; 371/10.1, 10.2, 21.2

[56] References Cited

U.S. PATENT DOCUMENTS

| | | | |
|---|---|---|---|
| 4,744,060 | 5/1988 | Okajima | 365/200 |
| 4,817,056 | 3/1989 | Furutani et al. | 365/200 |
| 4,935,899 | 6/1990 | Morigami | 365/200 |
| 5,091,884 | 2/1992 | Kagami | 365/201 X |
| 5,132,937 | 7/1992 | Tuda et al. | 365/201 |
| 5,157,628 | 10/1992 | Tani | 365/200 |

FOREIGN PATENT DOCUMENTS

| | | |
|---|---|---|
| 0178950 | 4/1986 | European Pat. Off. ......... 365/200 |
| 4001223 | 11/1990 | Germany . |
| 4006285 | 7/1991 | Germany . |
| 62-217498 | 9/1987 | Japan . |
| 3-80500 | 4/1991 | Japan . |
| 3-93097 | 4/1991 | Japan . |

Primary Examiner—Joseph A. Popek
Assistant Examiner—Son Dinh
Attorney, Agent, or Firm—Lowe, Price, LeBlanc & Becker

[57] ABSTRACT

An SRAM disclosed herein includes 64 memory cell array blocks and a redundant memory cell array block. The redundant memory cell array includes a total of 16 redundant memory cell columns. A defect address indicating a location of a defective memory column is programmed in an address programming circuit, and the specific defecting column in the defect address is programmed in an I/O programming circuit. Although each memory cell does not include a spare memory cell column or row for redundancy, the defect can be repaired by using a redundant memory cell array, so that the high integration of the SRAM can be accomplished.

20 Claims, 12 Drawing Sheets

SEMICONDUCTOR MEMORY DEVICE INCLUDING REDUNDANT MEMORY CELL ARRAY FOR REPAIRING DEFECT

The present invention is related to application U.S. Ser. No. 08/024,141, filed Mar. 1, 1993, titled "Semiconductor Memory Device".

BACKGROUND OF THE INVENTION

1. Field of the Invention

The present invention relates generally to semiconductor memory devices and, more particularly, to semiconductor memory devices including redundant memory cell arrays for repairing defects. The present invention has particular applicability to a semiconductor memory device, more specifically to a static random access memory (SRAM), including a data comparing circuit for a test before shipment.

2. Description of the Background Art

Conventionally, a semiconductor memory, such as a static random access memory (hereinafter referred to as "SRAM") and a dynamic random access memory (hereinafter referred to as "DRAM"), includes a redundant circuit to increase a yield in manufacturing. When any defect exists in a manufactured semiconductor memory, it is repaired through a function of a redundant circuit thereof. More specifically, in a conventional semiconductor memory, a row or a column containing a defective memory cell is functionally replaced with a predetermined spare row or column. Although the present invention is generally applicable to a semiconductor memory, such as an SRAM and a DRAM, the following description explains the case in which the present invention is applied to an SRAM as an example.

FIG. 12 is a block diagram of a conventional SRAM including a redundant circuit. Referring to FIG. 12, an SRAM 100 comprises a memory cell array 80 for storing data, a row decoder 82 responsive to a row address signal RA for selecting a word line WL in the memory cell array 80, a column decoder 83 responsive to a column address signal CA for selecting a column in the memory cell array 80, a write driver circuit 84, and a sense amplifier 85. The SRAM 100 further comprises a spare memory cell column 81 as a redundant circuit, an address programming circuit 86 for programming a defect address indicating a location where a defect exists, and an I/O programming circuit 87.

In operation, the row decoder 82 activates one word line WL in the memory cell array 80 in response to the externally applied row address signal RA. The column decoder 83 selects one column to be accessed in response to the externally applied column address signal CA. More specifically, the column decoder 83 selectively turns on a transmission gate TG1 connected to a column to be accessed so that its bit line can be electrically connected to the write driver 84 or the sense amplifier 85. In writing operation, therefore, an externally applied input data Di is written in the memory cell selected by the row decoder 82 and the column decoder 83. In reading operation, on the other hand, the sense amplifier 85 amplifies a data signal read from the selected memory cell by the row decoder 82 and the column decoder 83 and the amplified signal is provided as an output data Do.

If any defect is found to exist in a certain memory cell column, the defective memory cell column will functionally be replaced with the spare memory cell column 81 as follows. A defect address indicating a location of the defective memory cell column is programmed in the address programming circuit 86 by selectively blowing off a fuse (not shown). The address programming circuit 86 which includes a coincidence detecting circuit, not shown, detects a coincidence of the externally applied column address signal CA and the programmed address signal. A coincidence detecting signal CO is then applied to the I/O programming circuit 87.

A fuse in the I/O programming circuit 87 (not shown) is previously selectively blown off so that a bit line in the spare memory cell column 81 is connected via the transmission gate circuit TG2 to the write driver circuit 84 and/or the sense amplifier 85. As a result, when the column address signal CA coincides with the programmed address signal, access to the spare memory cell column 81 is made in place of normal access to the memory cell array 80. At this time, the transmission gate circuit TG1 is turned off.

While FIG. 12 shows the memory cell array 80 and its peripheral circuits 82, 83 . . . , for the purpose of simplifying the description, a conventional SRAM generally comprises a plurality of memory cell arrays and peripheral circuits thereof. More specifically, while FIG. 12 shows only a block of a memory cell array and its peripheral circuits, a plurality (for example, 64) of blocks are provided in practice.

Since one or two spare memory cell columns (or rows) are provided in each of the memory cell arrays 80 as can be seen from FIG. 12, an SRAM including a plurality (for example, 64) of memory cell arrays contains 64 or 128 spare memory cell columns (or rows).

After an SRAM containing a defect is repaired utilizing a spare memory cell column thereof as described above, the following test before shipment is carried out in a manufacturing factory of semiconductor devices. A test mode signal is first externally applied to the SRAM so that the SRAM can be made to be in a test mode. In the test mode, test data are written into two memory cell arrays within the SRAM. The written test data, namely the two stored data from the two memory cell arrays are then read. The two read data are applied to a comparing circuit to detect whether these data coincide with each other. If the two read data coincide, a defect in the SRAM will be recognized to have been repaired, and if a coincidence is not detected, indicating that the SRAM contains a further detect therein, a further measure will be taken for repairing the defect.

In general, a comparing circuit can compare two data having multi-bits (for example, 8 bits). More specifically, a comparing circuit can detect a coincidence of two read data between corresponding bits thereof. Since one coincidence detecting operation can determine the presence of a defect in a plurality of memory cells, a verification test before shipment can be completed in a short period.

FIG. 13 is a diagram of the transmission gate circuits TG1 and TG2 shown in FIG. 12. Referring to FIG. 13, the transmission gate circuit TG1 is connected between a bit line pair BLa and BLb and a data line pair DLa and DLb in a normal memory cell array, while the transmission gate circuit TG2 is connected between a bit line pair RBLa and RBLb and the data line pair DLa and DLb in a spare memory cell column. The transmission gate circuit TG1 is turned on in response to a column selecting signal of a high level $Y_L$ applied from a column decoder (not shown), so that the bit line pair BLa and BLb and the data line pair DLa and DLb are electrically connected. Although a power supply potential Vcc is applied to a gate of an NMOS transistor 89, thereby turning the transistor 89 on, the column selecting signal $Y_L$ is not affected in potential because of a high on resistance of the transistor 89. Therefore, the column selecting signal of a high level $Y_L$ is correctly applied to the transmission gate circuit TG1 through a fuse 88.

If any defect exists in a memory cell MC1, the fuse 88 is blown off, and the grounded potential is applied via the transistor 89 to the transmission gate circuit TG1 which is then turned off. On the other hand, when a column address signal selecting the column containing memory cell MC1 is applied, a signal of a high level RY is applied via the I/O programming circuit 87 to the transmission gate circuit TG2, which is then turned on. Consequently, the column containing MC1 and the spare memory cell column 81 are functionally replaced.

As described above, a conventional semiconductor memory includes a plurality of memory cell arrays and one or two spare memory cell columns for each memory cell array. Therefore, an SRAM including 64 memory cell arrays, for example, has an ability to repair 64 or 128 defective memory cell columns or rows. In practice, however, not so much repairing ability is necessary because not so many defects can exist in a semiconductor memory experientially. In the aforementioned SRAM, for example, it is experientially recognized that ten or less defects at most can exist. In other words, a conventional semiconductor memory comprises spare memory columns or rows excessively, although unnecessary from the practice point of view, which prevents high integration of a semiconductor memory.

In addition, a conventional spare memory column or row cannot be used for repairing a column or row in other memory cell arrays, for it is provided for each memory cell array. More specifically, when defects exist in more than two memory cell columns or rows, they cannot be repaired, since they cannot be repaired by utilizing one or two spare memory cell columns or rows.

SUMMARY OF THE INVENTION

One object of the present invention is to repair a memory cell array containing a defect, efficiently from the point of high integration, in a semiconductor memory device including a plurality of memory cell arrays.

Another object of the present invention is to repair a memory cell array containing more than two defects in a semiconductor memory device including a plurality of memory cell arrays.

Briefly, a semiconductor memory device in accordance with the present invention includes a plurality of memory cell arrays including memory cells, each arranged in rows and columns, a redundant memory cell array including redundant memory cells arranged in rows and columns, a defect address storage circuit storing a defect address signal for indicating a defective portion in the plurality of memory cell arrays, an address coincidence detecting circuit detecting a coincidence between an externally applied address signal and the defect address signal stored in the defect address storage circuit, a redundant access circuit responsive to the address coincidence detecting circuit for accessing the redundant memory cell array in place of one of the plurality of memory cell arrays, and a data comparing circuit for comparing two data read from the plurality of memory cell arrays and/or the redundant memory cell array in external designation of a test mode.

In operation, the redundant memory cell array is provided, and the redundant access circuit accesses the redundant memory cell array when it is requested externally to access a defective portion in the plurality of memory cell arrays. The defective memory cell array, therefore, can be repaired efficiently from the point of high integration, utilizing the redundant memory cell array. Furthermore, the presence of a defect can be detected in a short period in the semiconductor memory device having the foregoing configuration, because of the data comparing circuit provided therein.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
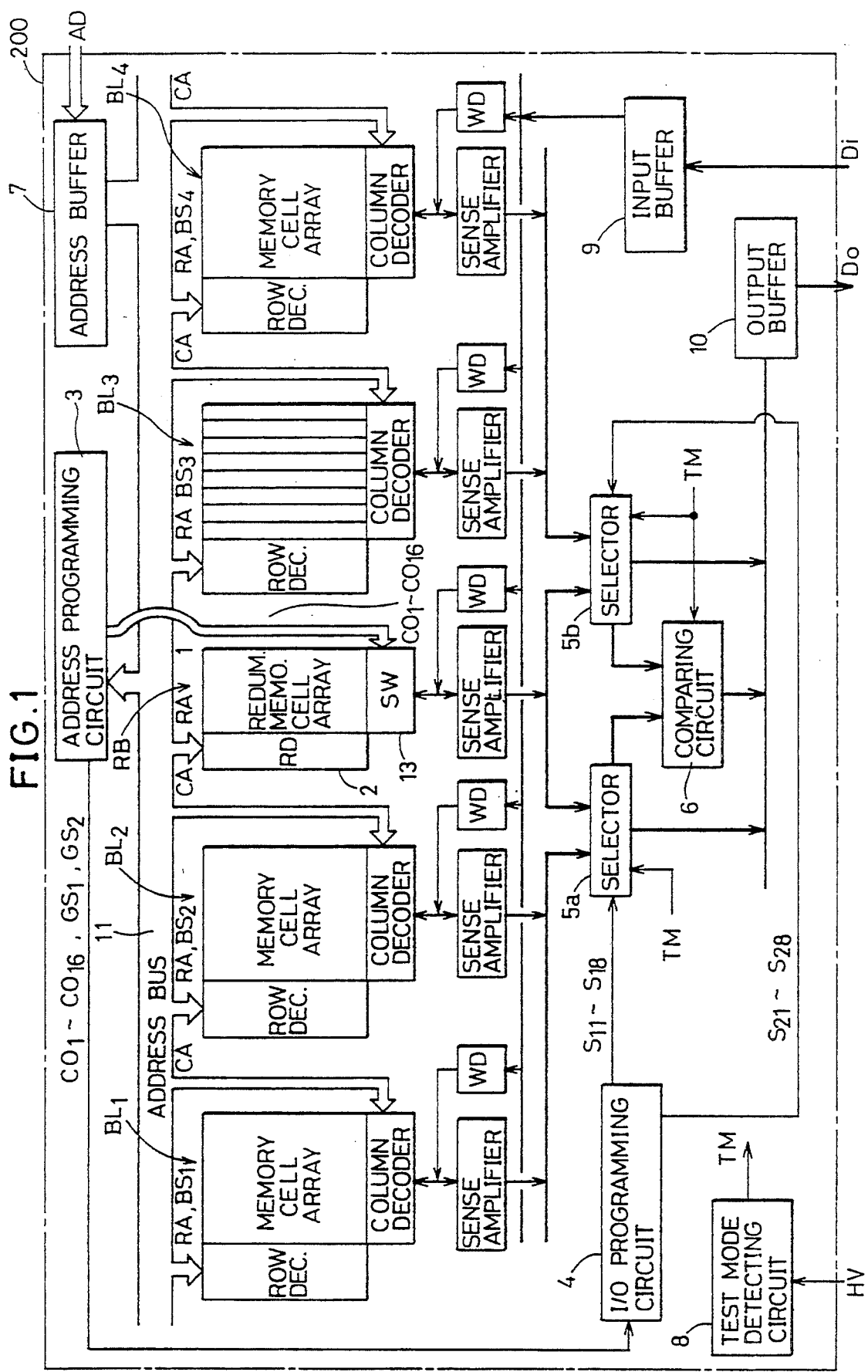
FIG. 1 is a block diagram of an SRAM illustrating an embodiment of the present invention.

Referring to FIG. 1, an SRAM 200 shown therein comprises a total of 64 blocks, each including a memory cell array, and a redundant block RB including a redundant memory cell array 1. To simplify the description, only four blocks BL1–BL4 are shown in FIG. 1. One of the 64 blocks, for example, the block BL3 comprises a memory cell array divided into eight areas, a row decoder, a column decoder, a sense amplifier circuit including eight sense amplifiers (not shown), and a write driver circuit (WD). In each block, a basic circuit configuration of a memory cell array and its peripheral access circuits is the same as that of a conventional SRAM, except that a spare memory cell column or row is not provided in each block.

The redundant block RB comprises the redundant memory cell array 1 including a total of 16 redundant memory cell columns, a row decoder (RD) 2, and a switching circuit 13 for selectively accessing the redundant memory cell array. The row decoder 2 selectively activates a word line (not shown) in the redundant memory cell array in response to a row address signal RA applied via an address bus 11. The switching circuit 13 responds to the activated one of signals CO1–CO16 applied from an address programming circuit 3 to connect a corresponding one of the redundant memory cell columns to the sense amplifier circuit and/or the write driver circuit.

A test before shipment can determine whether any defect exits in the total of 64 memory cell arrays. If a defect exists in a column of a certain memory cell array, an address indicating a location of the defective memory cell column (hereinafter referred to as "defect address") is programmed in the address programming circuit 3. The address programming circuit 3 can program a total of 16 defect addresses.

When external access of the defective memory cell column is requested, the address programming circuit 3 detects a coincidence of the programmed address and the externally applied column address, and applies a coincidence detecting signal (one of the signals CO1–CO16) and group selecting signals GS1 and GS2 to an I/O programming circuit 4.

The I/O programming circuit 4 responds to the coincidence detecting signal and the group selecting signals GS1 and GS2 applied from the address programming circuit 3 to apply switching control signals S11–S18 and S21–S28 to selectors 5a and 5b respectively. Each of the selectors 5a and 5b includes eight switching circuits not shown, which are selectively turned on in response to the switching control signals S11–S18 or S21–S28 so that access of the redundant memory cell column is carried out in place of access of the defective memory cell column.

A test mode detecting circuit 8 detects an application of an externally applied high voltage HV referred to as "super VCC" (approximately seven volts, in the case of the power-supply voltage of five volts), recognizes an external designation of the test mode, and provides a test mode signal TM. The selector circuits 5a and 5b apply data read from a memory cell array to an output buffer 10 when they are not supplied with the test mode signal TM. The output buffer 10 then provides the read data as an output data Do. On the other hand, when supplied with the test mode signal TM, the selector circuit 5a and 5b apply data read from a memory cell array to a comparing circuit 6. The comparing circuit 6 responds to the test mode signal TM to detect whether the two data applied from the selector circuits 5a and 5b coincide. A signal indicating a result of the detection is provided outside via the output buffer 10. When the comparing circuit 6 provides a coincidence detecting signal, it indicates that no defect exists in the memory cell column storing the two read data, and when the comparing circuit 6 provides a signal indicating the inconsistency, it means that a defect exists in the memory cell column storing the two read data.

An input buffer 9 receives an external input data Di to be written therein and applies the input data Di to the write drive circuit (WD), so that the input data Di is written in a memory cell designated by a row decoder and a column decoder.

Figure 2:
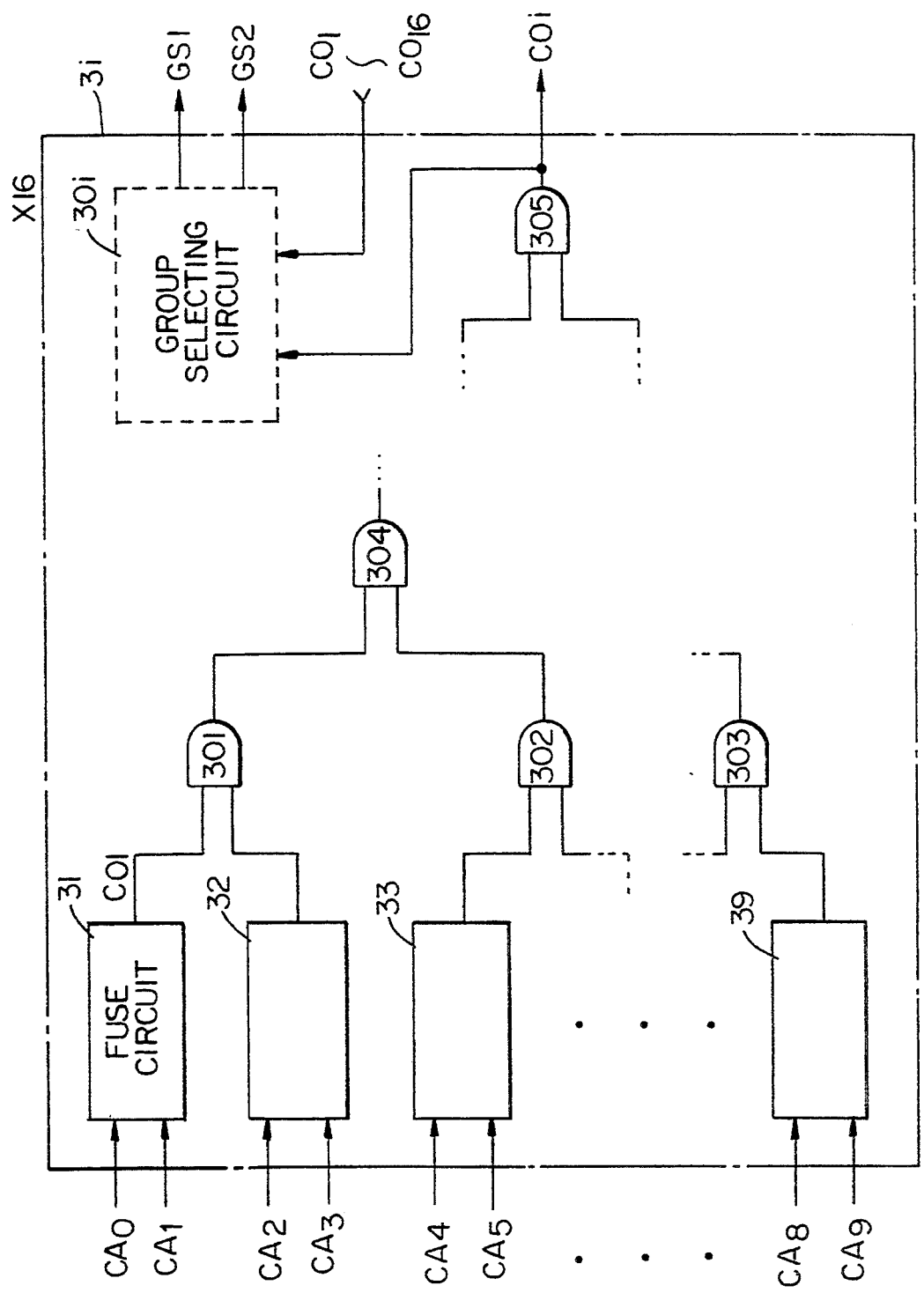
FIG. 2 is a block diagram of the address programming circuit illustrated in FIG. 1.

The following description explains the SRAM 200 shown in FIG. 1 in more detail. FIG. 2 is a block diagram of the address programming circuit 3 shown in FIG. 1. While the address programming circuit 3 includes a total of 16 circuit blocks, the i-th block 3i is shown in FIG. 2. Referring to FIG. 2, the address programming circuit block 3i comprises fuse circuits 31–39 for programming a defect address, AND gates 301–305 for detecting a coincidence of externally applied column addresses CA0–CA9 and the programmed defect address, and a group selecting circuit 30i for generating the group selecting signals GS1 and GS2. Each of the fuse circuits 31–39 receives two corresponding ones of a total of ten bits of the column address signals CA0–CA9.

Figure 3:
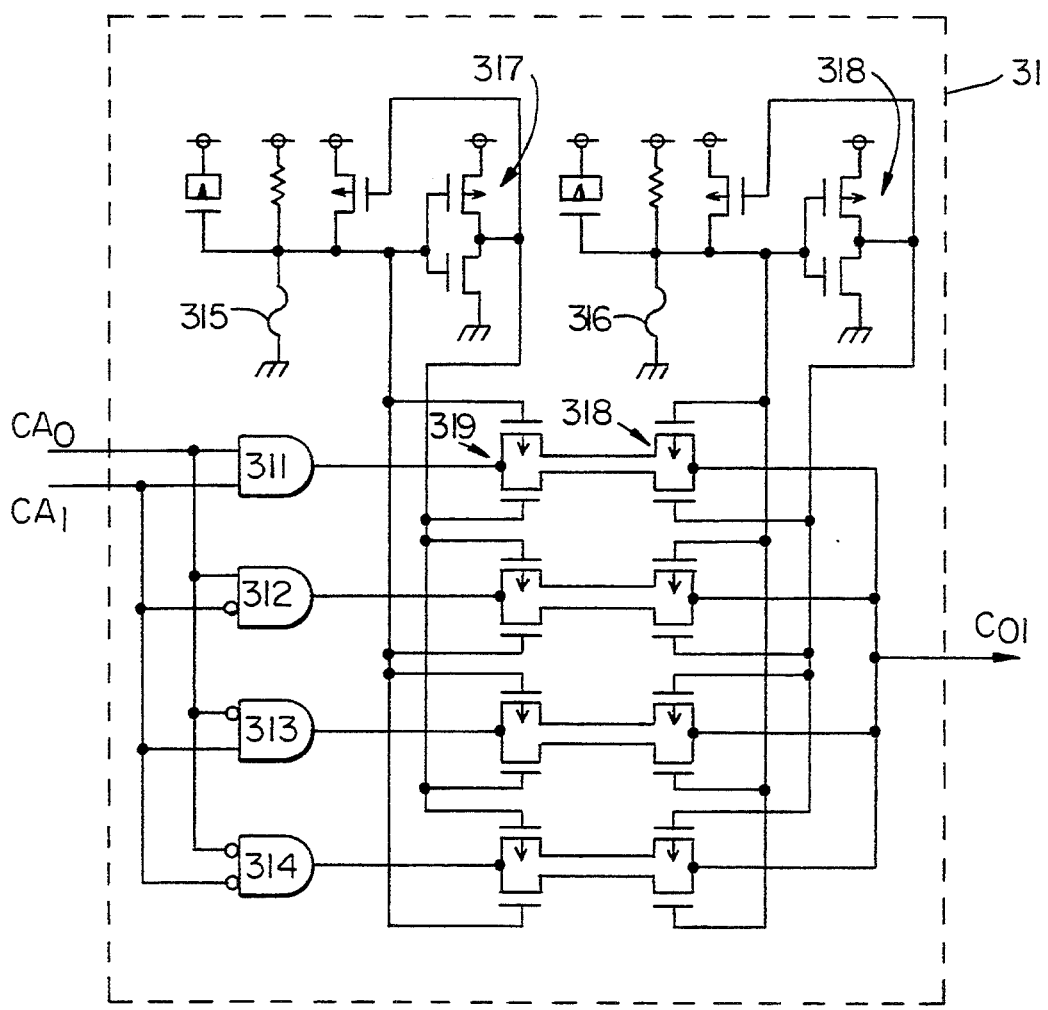
FIG. 3 is a diagram of the fuse circuit illustrated in FIG. 2.

Referring to FIG. 3, the fuse circuit 31, for example, comprises AND gates 311–314 for predecoding the column address signals CA0 and CA1, and the fuses 315 and 316 for programming. A defect address signal of two bits can be programmed by selectively blowing off the two fuses 315 and 316. When the fuses 315 and 316 are connected, inverters 317 and 318 provides high level voltages respectively, while the inverters 317 and 318 provides low level voltages when the fuses 315 and 316 are blown off. The AND gate 311 provides a high level voltage when column address signals of a high level CA0 and CA1 are applied, and the AND gate 312 provides a high level voltage when the high level signal CA0 and the low level signal CA1 are applied.

The AND gate 313 provides a high level voltage when the low level signal CA0 and the high level signal CA1 are applied, and the AND gate 314 provides a high level voltage when the high level signals CA0 and CA1 are applied.

Therefore, where the fuses 315 and 316 are connected, for example, transmission gates 319 and 318 are turned on. In this case, when the column address signals of a high level CA0 and CA1 are applied, the AND gate 311 provides a high level signal $C_{0i}$ via the transmission gates 319 and 318. In other words, only when the two-bit defect address programmed by a "connection" of the fuses 315 and 316, and the column address CA0 and CA1 coincide, the fuse circuit 31 provides the high level signal $C_{0i}$. The signal $C_{0i}$ is then applied to the AND gate 301 shown in FIG. 2.

As a result, the i-th address programming circuit block 3i shown in FIG. 2 provides a high level address coincidence detecting signal COi, only when the programmed ten-bit defect address and the externally applied column address CA0–CA9 coincide. The group selecting circuit 30i is illustrated in FIG. 4.

Figure 4:
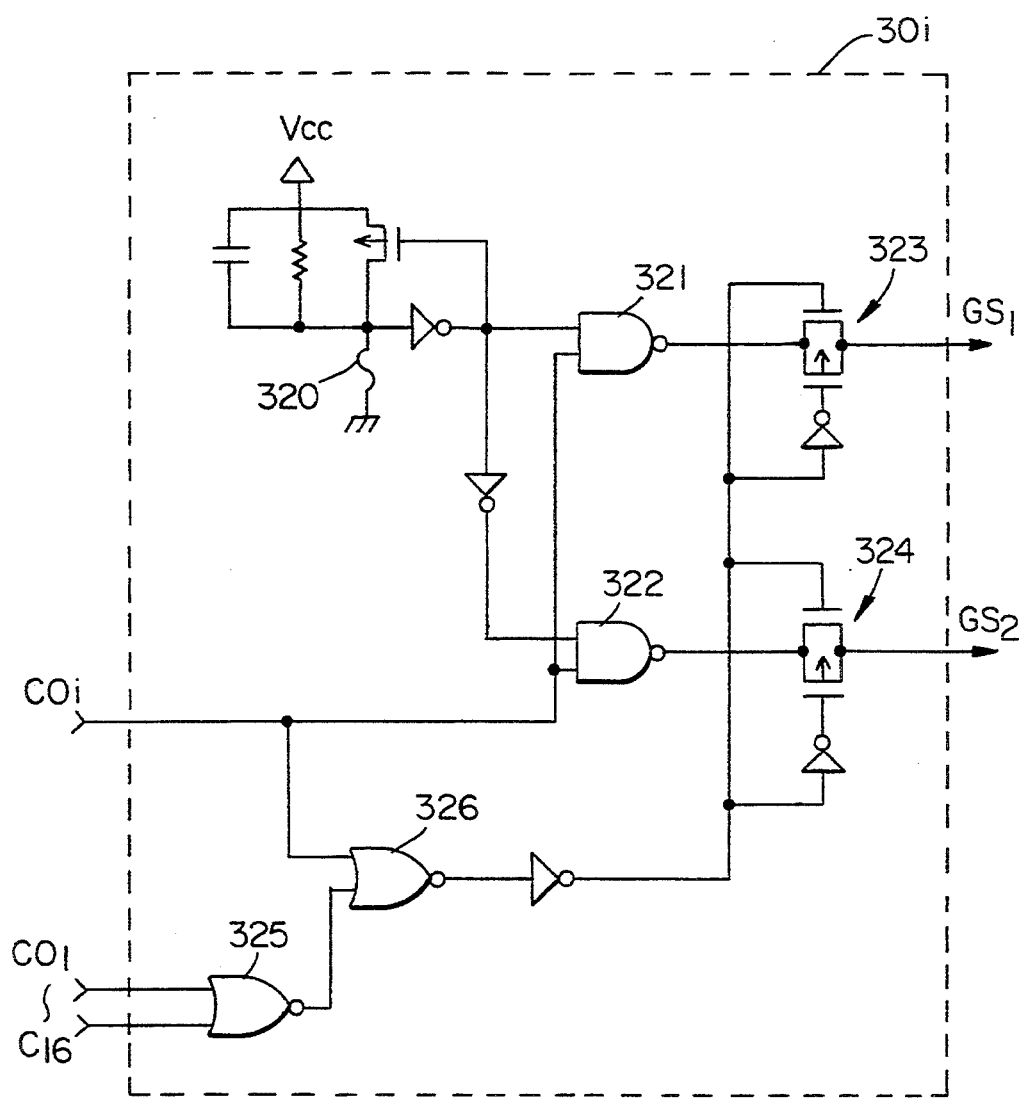
FIG. 4 is a diagram of the group selecting circuit illustrated in FIG. 2.

Referring to FIG. 4, the group selecting circuit 30i comprises a fuse 320 for programming, NAND gates 321 and 322, transmission gates 323 and 324, and NOR gates 325 and 326. The NOR gate 325 receives the address coincide detecting signals CO1–CO16 provided from other address programming circuits (not shown). The NOR gate 326 receives an output signal of the NOR gate 325 and the signal COi.

In operation, when the fuse 320 is blown off, the NAND gate 321 and 322 receive a low level voltage and a high level voltage respectively, so that the NAND gate 321 provides a high level voltage, while the NAND gate 322 serves as an inverter. On the contrary, when the fuse 320 is connected, the NAND gate 321 serves as an inverter, while the NAND gate 322 provides a high level voltage.

When a coincidence is detected for one of the programmed defect addresses, the NOR gate 325 provides a low level voltage, while when no coincidence is detected for all the programmed defect addresses, the NOR gate 325 provides a high level voltage. The NOR gate 326 provides a low level voltage when no coincidence is detected for all the programmed defect addresses. The transmission gates 323 and 324 are then turned on, and output voltages of the NAND gates 321 and 322 are provided as the group selecting signals GS1 and GS2.

When a coincidence is detected for one of the programmed defect addresses, and which is not generated in the i-th address programming circuit block 3i, the NOR gate 326 provides a high level voltage. The transmission gates 323 and 324 are then turned off and thus the group selecting signals GS1 and GS2 are not provided.

When a coincidence is detected in the i-th address programming circuit block 3i, the NOR gate 326 provides a low level voltage and the transmission gates 323 and 324 are then turned on. The high level address coincidence detecting signal COi is applied to the NAND gates 321 and 322 so that one of the NAND gate 321 and 322 which serves as an inverter provides a low level voltage. The group selecting signals GS1 and GS2 of voltage levels inverted from each other are thus provided depending on a connection state of the fuse 320.

Figure 5:
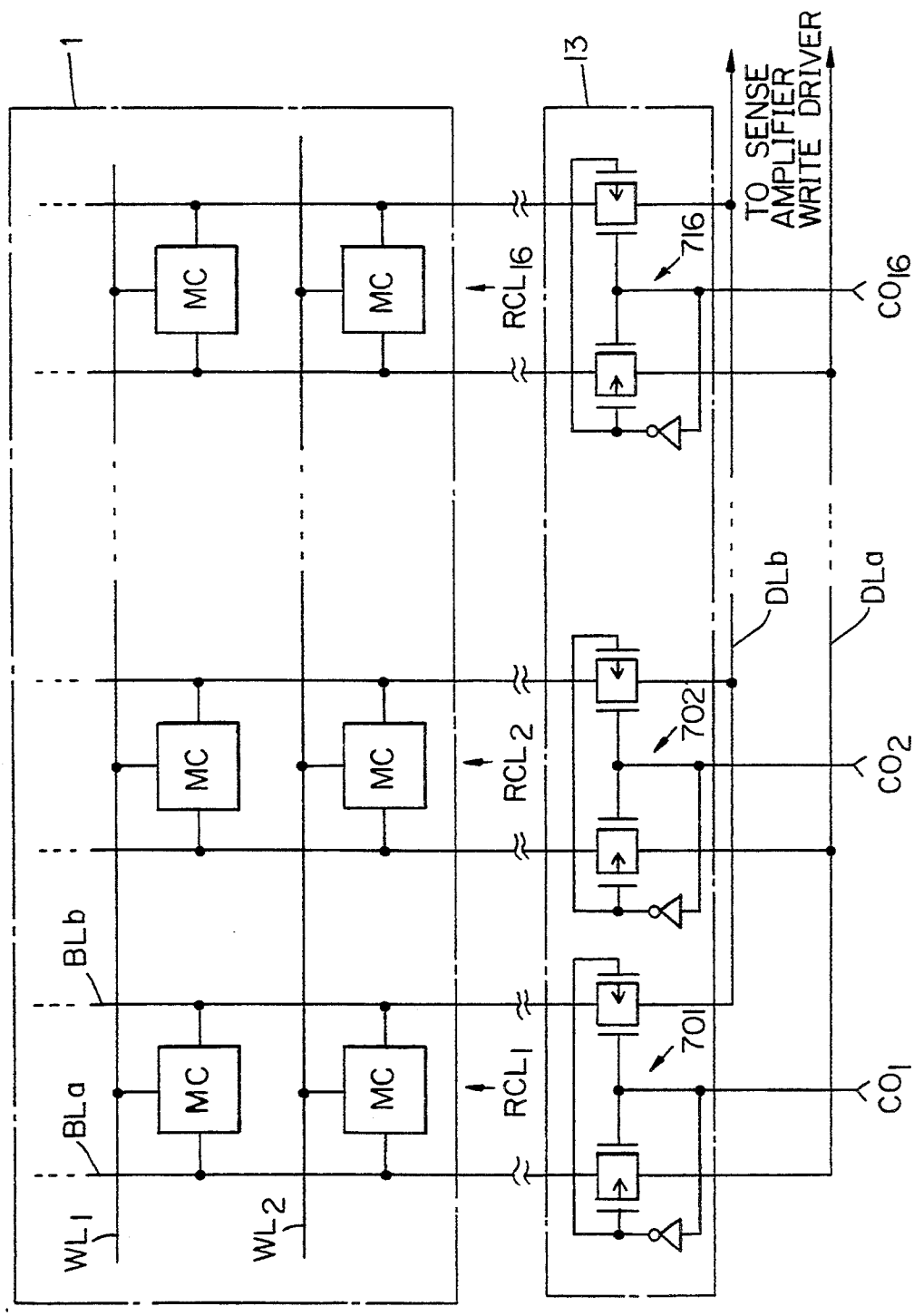
FIG. 5 is a schematic diagram of a circuit of the redundant memory cell array and the switching circuit illustrated in FIG. 1.

FIG. 5 is a schematic diagram of a circuit of the redundant memory cell array 1 and the switching circuit 13 shown in FIG. 1. Referring to FIG. 5, the redundant memory cell array 1 contains the memory cells MC arranged in rows and columns. The redundant memory cell array 1 comprises a total of 16 redundant memory cell columns RCL1–RCL16. Word lines WL1 and WL2 are selectively activated by the row decoder 2 shown in FIG. 1.

A switching circuit 13 comprises transmission gate circuits 701–716, each of which is connected to a corresponding redundant memory cell column. Each of the transmission gate circuits 701–716 is turned on in response to a corresponding one of the address coincidence detecting signals CO1–CO16 applied from the address programming circuit 3. The transmission gate 701, for example, is turned on in response to the high level address coincidence detecting signal CO1, so that a bit line pair BLa and BLb in the redundant memory cell column RCL1 is connected to a data line pair DLa and DLb. Therefore, when a column address signal which coincides with a defect address programmed in the address programming circuit 3 is applied externally, any one of the transmission gate circuits 701–716 is turned on in response to the address coincidence detecting signals CO1–CO16 so that one of the redundant memory cell columns RCL1–RCL16 is accessed.

The following description explains the I/O programming circuit 4 shown in FIG. 1. The I/O programming circuit 4 comprises 16 defective column designating circuits $4a_1$–$4a_{16}$ corresponding to 16 address programming circuit blocks, a decode circuit 4b for a defective column code, and the switching control signal distribution circuits 4c and 4d. Since eight columns in a memory cell array can be accessed simultaneously by an externally applied column address signal, it is necessary to program a defective memory cell column not to be accessed. In other words, since a false data may be read from the defective memory cell column, it is necessary to provide a data read from the redundant memory cell column in place of that read from the defective memory cell column. The designation or programming of the column containing a defect in the eight columns which can be accessed in response to a defect address is carried out by blowing off fuses in the defective column designating circuits $4a_1$–$4a_{16}$ selectively.

Figure 6:
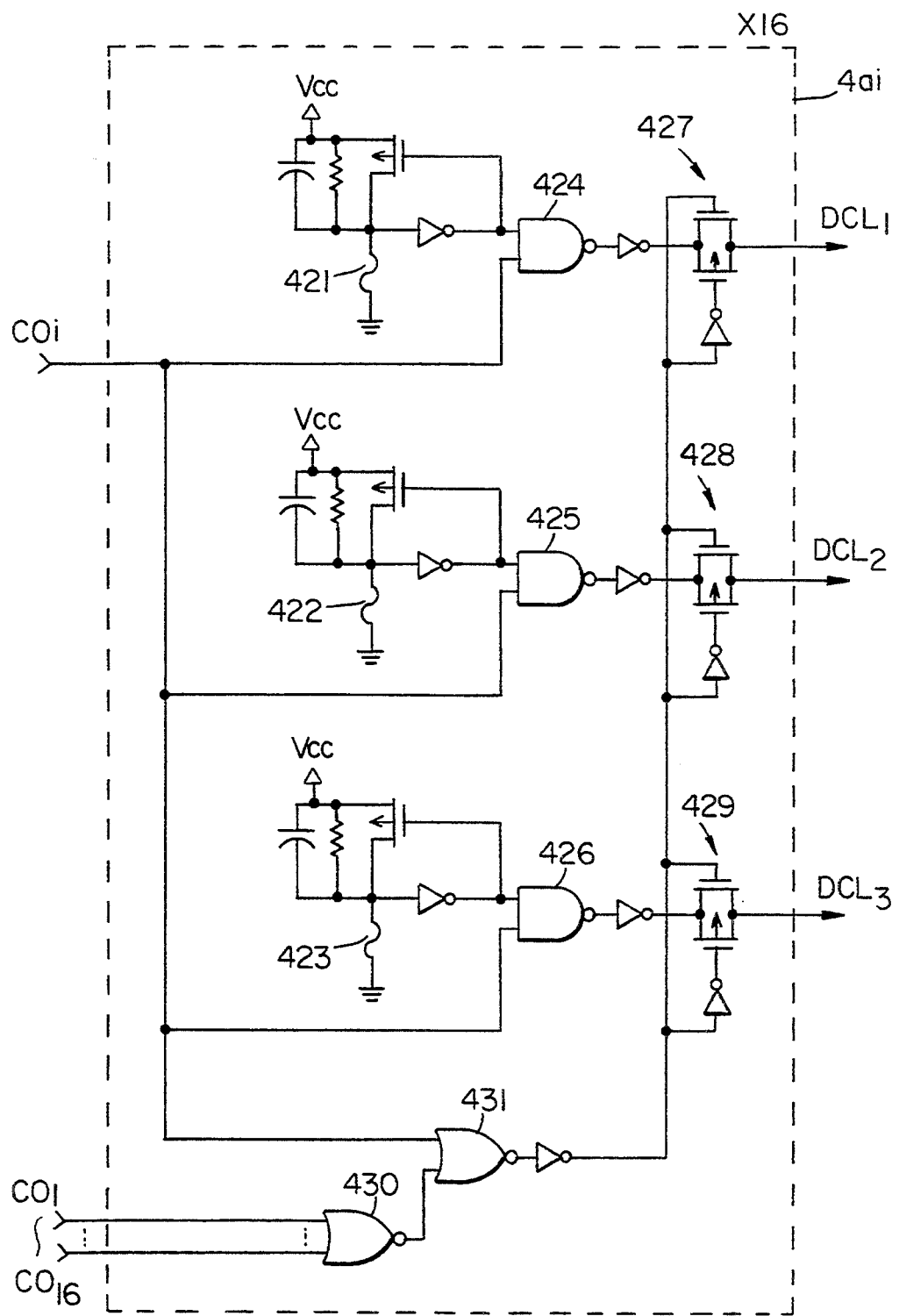
FIG. 6 is a diagram of a defective column designating circuit in the I/O programming circuit illustrated in FIG. 1.

Referring to FIG. 6, the i-th circuit $4a_1$ of the defective column designating circuits $4a_1$–$4a_{16}$ is shown. The defective column designating circuit $4a_1$ comprises fuses 421–423 for programming, NAND gates 424–426, transmission gates 427–429, and NOR gates 430 and 431.

In operation, when the address coincidence detecting signal COi is at a low level, the NAND gates 424 and 426 always provide high level voltages without depending on connection states of the fuses 421–423. Thus, when the transmission gates 427 and 429 are turned on, low level defective column designating signals (or defective column designating codes) DCL1–DCL3 are provided.

When the high level address coincidence detecting signal COi is applied, the NAND gates 424–426 provide signals depending on connection states of the fuses 421–423. When the fuse 421 is connected, for example, the NAND gate 424 receives a high level voltage. The NAND gate 424 provides a low level signal so that the defective column designating signal DCL1 becomes a high level. When the fuse 421 is blown off, the NAND gate 424 receives a low level voltage. The NAND gate 424 provides a low level signal so that the signal DCL becomes a low level.

In summary, when a coincidence is detected in the corresponding address programming circuit block 3i, to which the high level signal COi is applied, each of the defective column designating signal DCL1–DCL3 becomes a high level or a low level respectively depending on connection or disconnection of the corresponding fuse. Where the low level address coincidence detecting signal COi is applied, the defective column designating signals DCL1–DCL3 all of which are at a low level are provided. Selective blowing off of the three fuses 421–423 enables one of the eight memory cell columns which can be designated by a column address signal to be designated or programmed.

The three transmission gates 427–429 shown in FIG. 6 operate as follows. First, where all the address coincidence detecting signals CO1–CO16 are at a low level, the NOR gate 430 applies a high level signal to the NOR gate 431. The NOR gate 431 provides a low level signal so that the transmission gates 427–429 are turned on. In this case, since the address coincidence detecting signal COi is at a low level, the defective column designating signals DCL1–DCL3 all of which are at a low level are provided by the transmission gate 427–429.

Secondly, where the signal COi is at a low level with one of the other address coincidence detecting signals CO1–CO16 (excluding COi) being at a high level, the NOR gate 430 applies a low level signal to the NOR gate 431. Thus, receiving two low level signals, the NOR gate 431 provides a high level signal so that the transmission gates 427–429 are turned off. This prevents defective column designating signals provided from more than one defective column designating circuit from collision.

When the high level address coincidence detecting signal COi is provided, the NOR gate 431 provides a low level signal. The transmission gates 427–429 are then turned on, and the defective column designating signals DCL1-DCL3, which are determined depending on connection states of the fuses 421-423, are provided.

Figure 7:
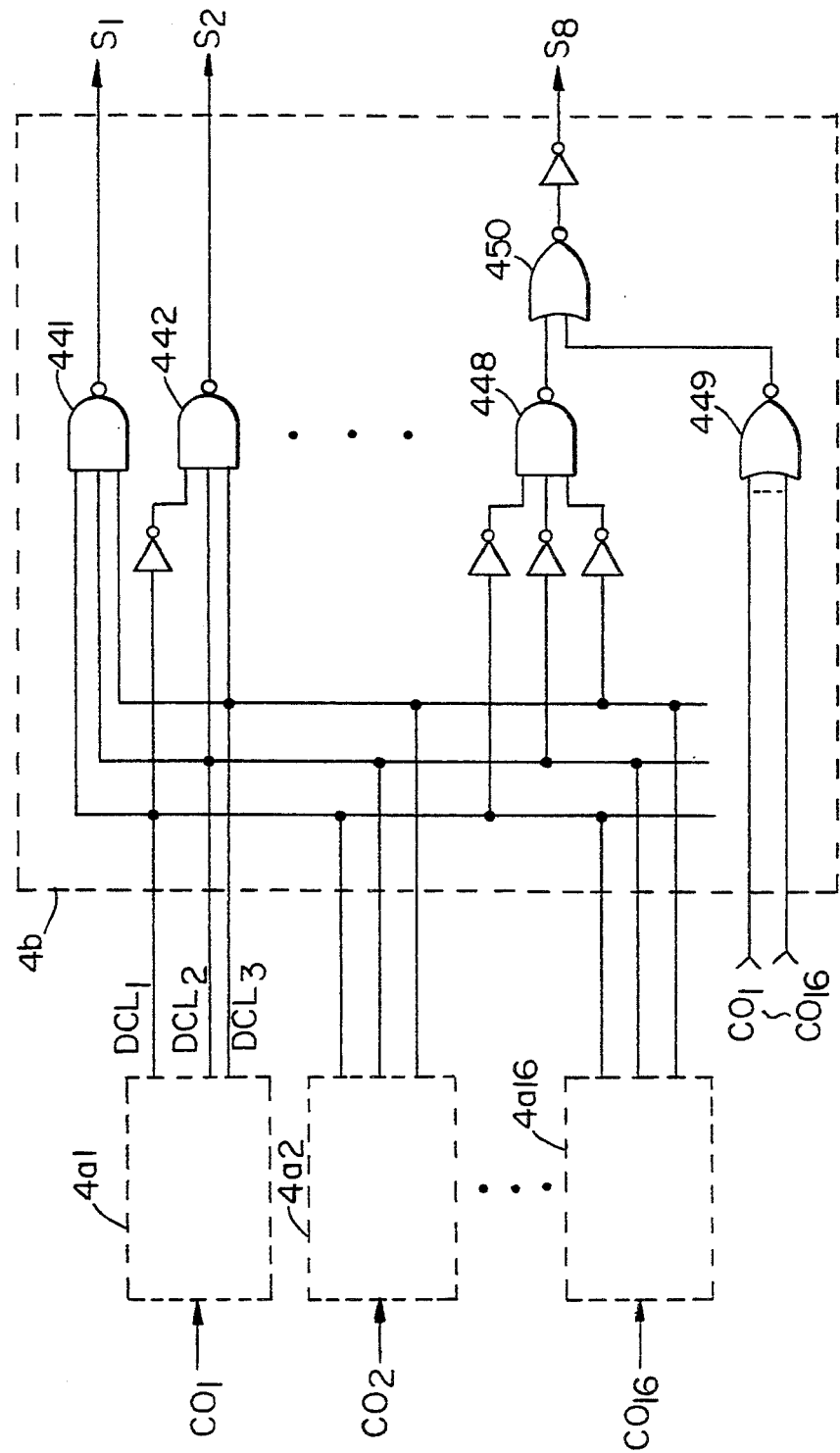
FIG. 7 is a circuit diagram of a decode circuit for defective column designating codes in the I/O programming circuit illustrated in FIG. 1.

FIG. 7 is a diagram of the decode circuit 4b for defective column designating codes provided in the I/O programming circuit 4 shown in FIG. 1. Referring to FIG. 7, the decode circuit 4b is connected to the output of the 16 defective column designating circuits $4a_1$–$4a_{16}$. One of the defective column designating circuits $4a_1$–$4a_{16}$ provides the defective column designating codes DCL1-DCL3 in response to the address coincidence detecting signals CO1-CO16.

The decode circuit 4b comprises NAND gates 441-448 for decoding, and NOR gates 449 and 450. When all the address coincidence detecting signals CO1-CO16 are at a low level, the defective column designating signals DCL1-DCL3 are at a low level so that the decode circuit 4b provides the switching control signals S1-S8 all of which are at a high level.

When one of the address coincidence detecting signals CO1-CO16 is at a high level, one of the defective column designating circuits $4a_1$–$4a_{16}$ provides the defective column designating codes DCL1-DCL3. The defective column designating codes DCL1-DCL3 are decoded by the NAND gates 441-448, and one of the switching control signals S1-S8 becomes a low level. The switching control signals S1-S8 are applied to distribution circuits 4c to 4d shown in FIG. 8.

Figure 8:
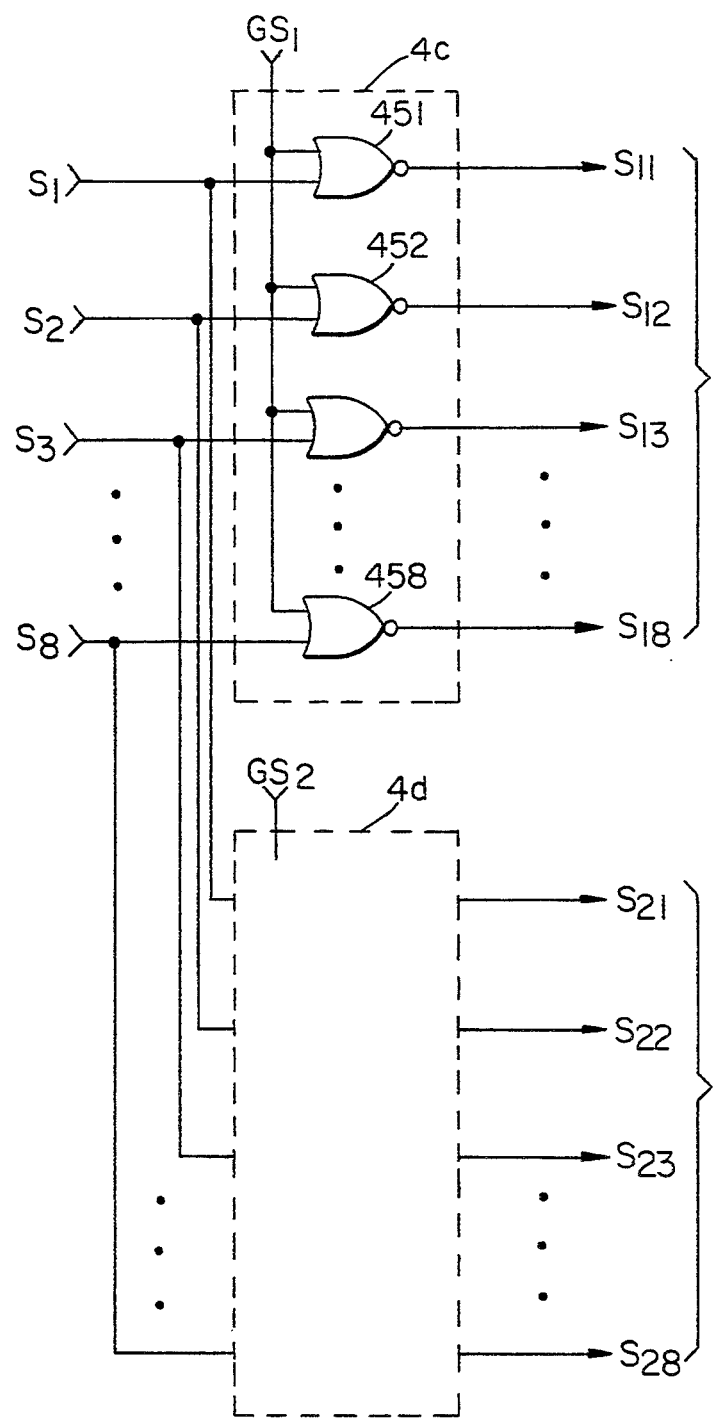
FIG. 8 is a diagram of a switching control signal distributing circuit in the I/O programming circuit illustrated in FIG. 1.

Referring to FIG. 8, the switching control signal distribution circuit 4c includes NOR gates 451-458, each having two inputs. One input of each of the NOR gates 451-458 receives the group selecting signal GS1 applied from the address programming circuit 3. The other input of each of the NOR gates 451-458 receives a corresponding one of the switching control signals S1-S8. The switching control signal distribution circuit 4d also has the same circuit configuration as that of the circuit 4c. The distribution circuit 4d is controlled in response to the group selecting signal GS2.

When a group 1 is selected, that is when the low level signal GS1 is applied, the NOR gates 451-458 apply inverted signal S11-S18 of the input signals S1-S8 to a selector circuit 5a. The distribution circuit 4c applies the switching control signals S11-S18 including a high level signal to the selector circuit 5a. At this time, the distribution circuit 4d applies to a selector circuit 5b signals S21-S28 all of which are at a low level in response to the high level group selecting signal GS2. Thus, in the above example, switching for repairing a defective memory cell column is carried out only in the selector circuit 5a.

Figure 9:
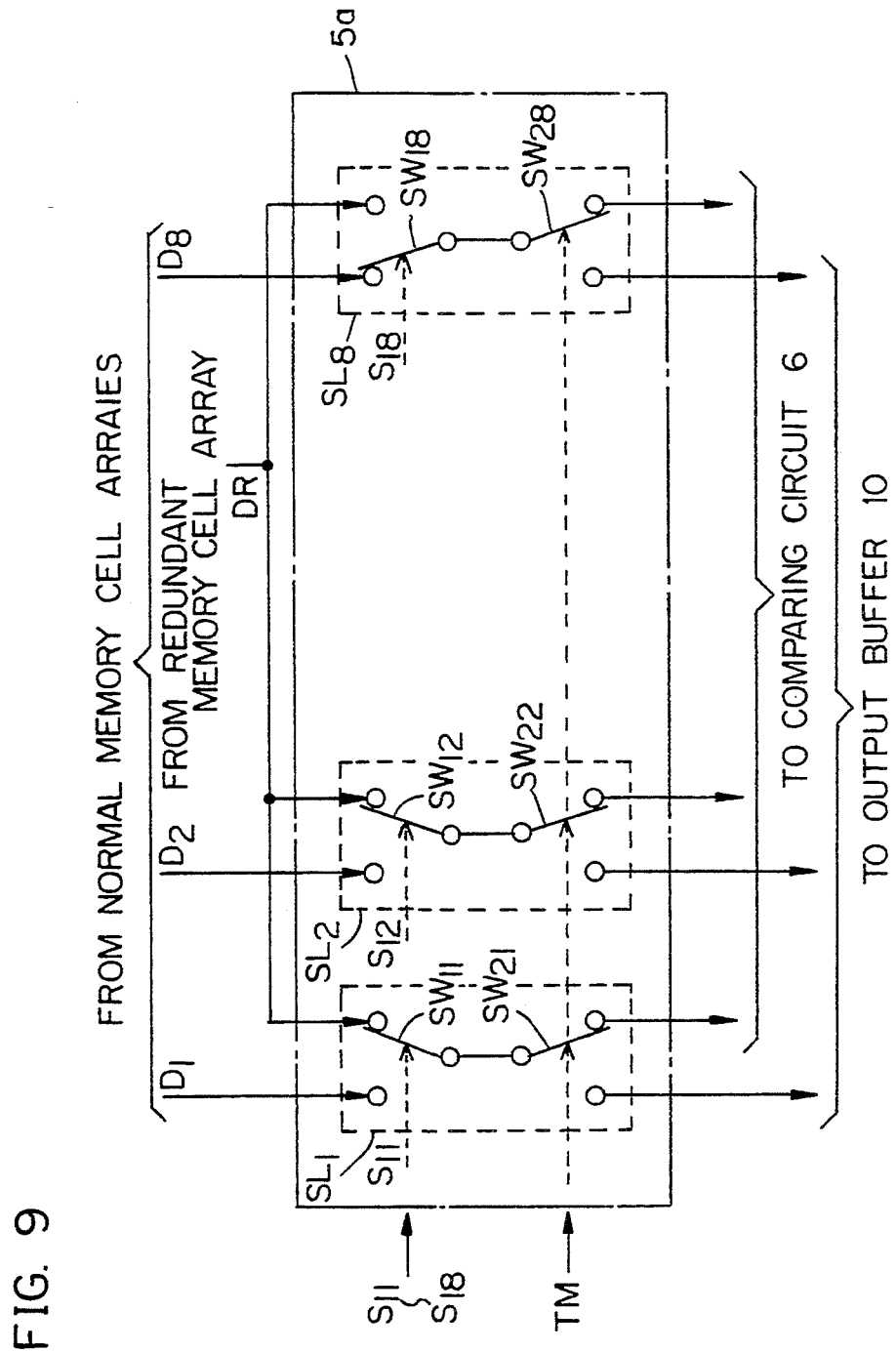
FIG. 9 is a block diagram of the selector circuit illustrated in FIG. 1.

FIG. 9 is a block diagram of the selector circuit 5a shown in FIG. 1. The selector circuit 5b also has the same circuit configuration as that of the selector circuit 5a. Referring to FIG. 9, the selector circuit 5a includes switching circuits SL1-SL8, each having two switching elements. For example, the switching circuit SL1 comprises a switching element SW11 controlled in response to the switching control signal S11 and a switching element SW21 controlled in response to the test mode signal TM. Each of the switching elements SW11-SW18 provided in the switching circuit SL1-SL8 is controlled respectively in response to a corresponding signal of the switching control signals S11-S18. The switching element SW21-SW28 provided in the switching circuits SL1-SL8 is controlled in response to the test mode signal TM.

First terminals of the switching elements SW11-SW18 receive data signals D1-D8 read from normal memory cell arrays respectively. Second terminals of the switching elements SW11-SW18 receive a read data DR from a redundant memory cell array. First terminals of the switching elements SW21-SW28 are connected to the output buffer 10. Second terminals of the switching elements SW21-SW28 are connected to the comparing circuit 6.

In operation, when only the signal S11 in the switching control signals S11-S18 is at a high level, for example, the switching element SW11 is connected to on the side of the redundant memory cell array, and the read data DR from the redundant memory cell array is applied via the switching element SW11 to the switching element SW21 in place of the data D1. When a test mode is designated, the applied data is applied via the switching element SW21 to the comparing circuit 6, while when the test mode is not designated, the applied data is applied to the output buffer 10.

Figure 10:
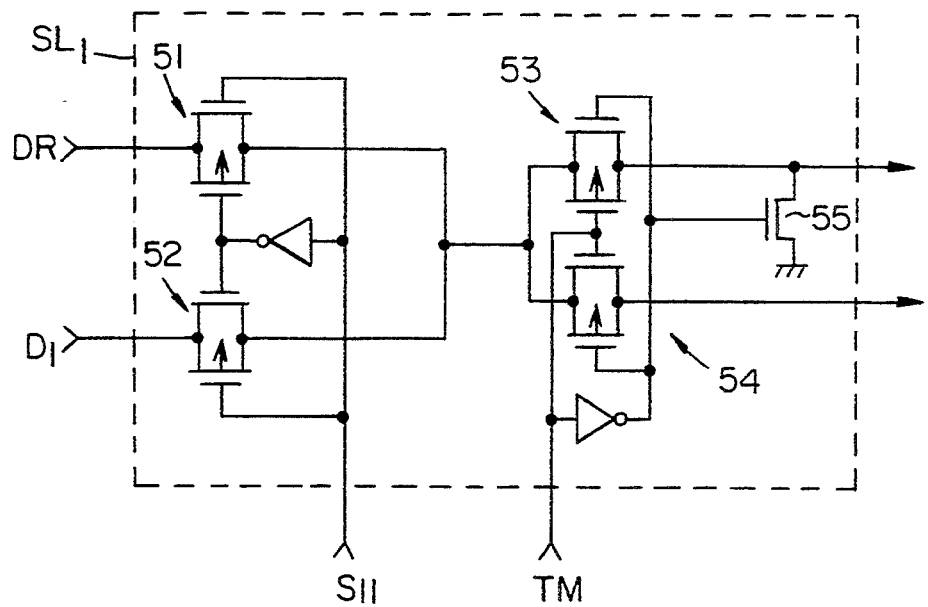
FIG. 10 is a diagram of the switching circuit illustrated in FIG. 9.

FIG. 10 is a diagram of the switching circuit SL1 shown in FIG. 9. Referring to FIG. 10, the switching circuit SL1 includes transmission gates 51 and 52 controlled in response to the switching control signal S11, transmission gates 53 and 54 controlled in response to the test mode signal TM, and an NMOS transistor 55. In operation, when the signal S11 is at a high level, for example, the transmission gate 51 is turned on. When the test mode signal TM is at a low level, the transmission gates 53 is turned on. In the above example, the read data DR from the redundant memory cell array is applied via the transmission gates 51 and 53 to the comparing circuit 6.

Figure 11:
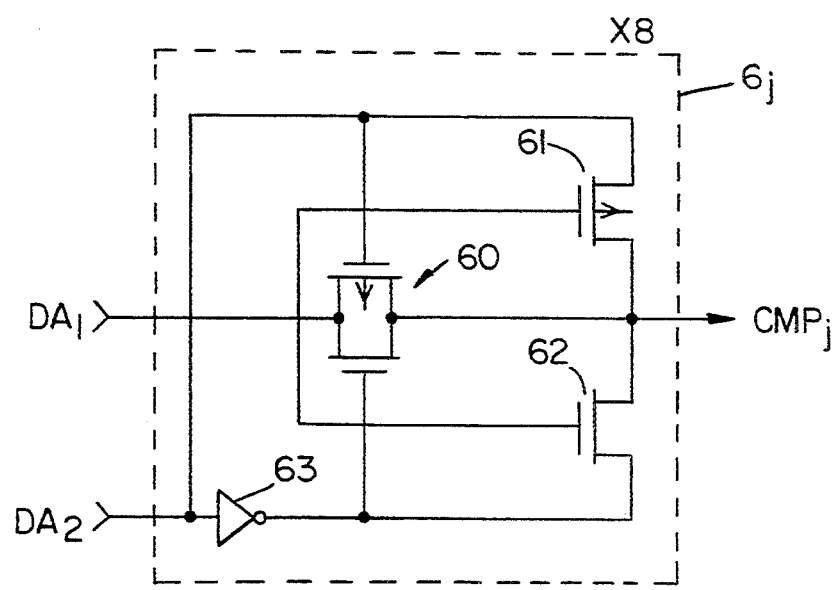
FIG. 11 is a diagram of the comparing circuit illustrated in FIG. 1.
Figure 12:
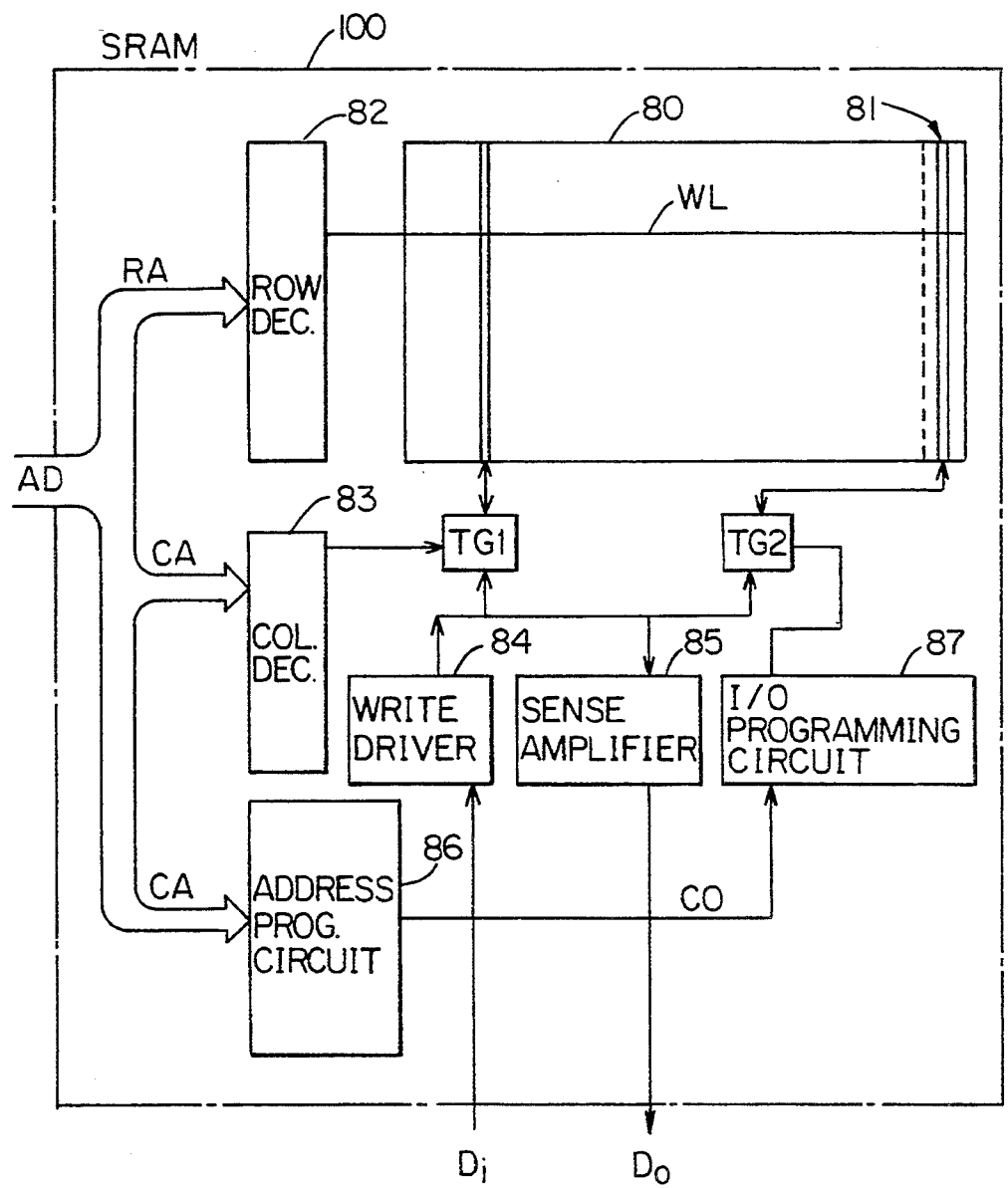
FIG. 12 is a block diagram of a conventional SRAM comprising a redundant circuit.
Figure 13:
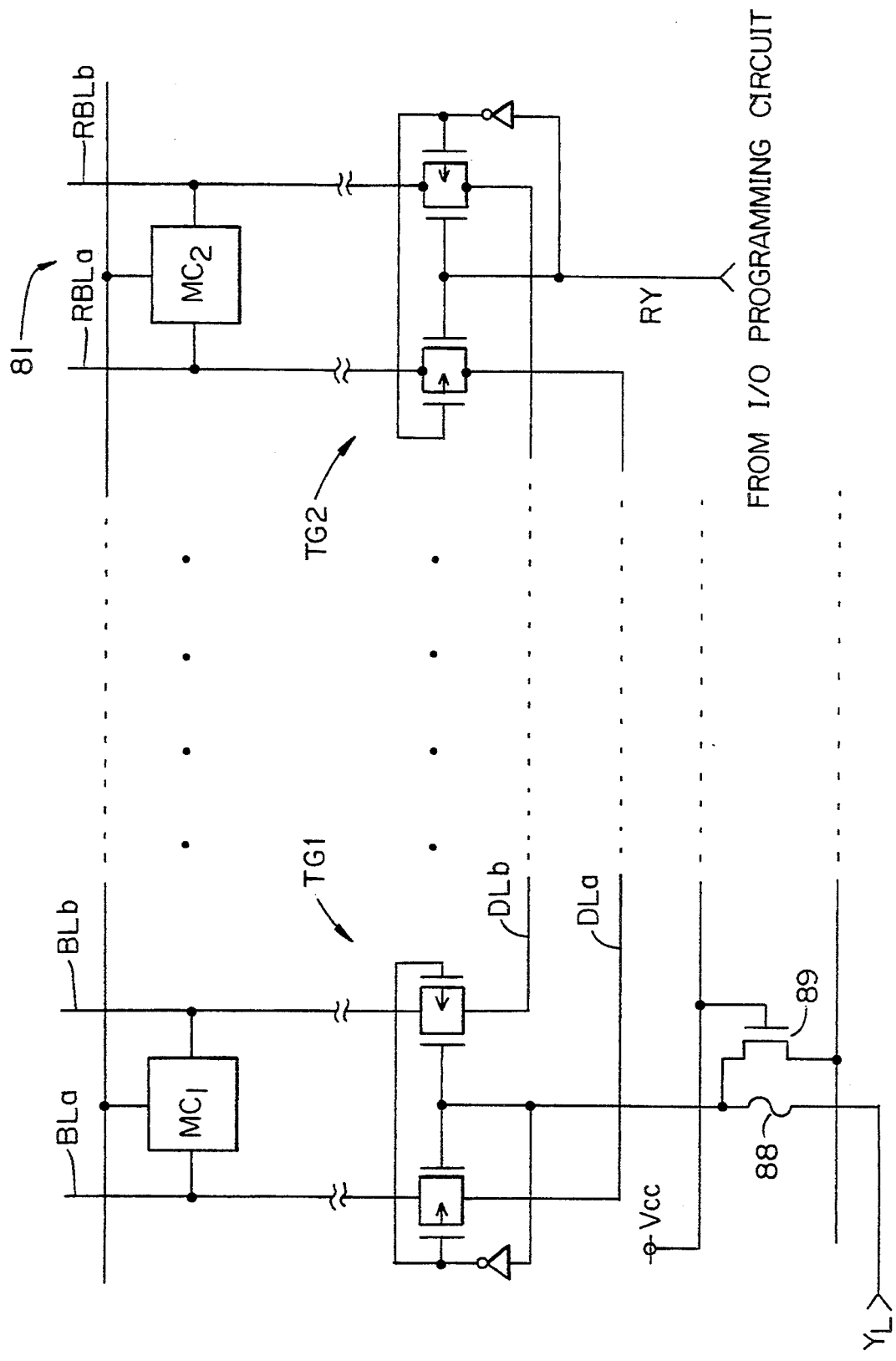
FIG. 13 is a diagram of the transmission gate circuit illustrated in FIG. 12.

FIG. 11 is a diagram of the comparing circuit 6 shown in FIG. 1. The comparing circuit 6, though being able to detect a coincidence between two data each having 8 bit, is only shown a circuit portion which compares a corresponding pair of bite of the two data in FIG. 1. Referring to FIG. 11, a comparing circuit 6j for the j-th bit includes a transmission gate 60 receiving a bit signal DA1 of a first data, an inverter 63 receiving a bit signal of a second data, a PMOS transistor 61, and an NMOS transistor 62.

When the signals DA1 and DA2 are both at a high level, the inverter 63 provides a low level voltage. Only the transistor 62 being turned on, a low level voltage is provided as a comparison result signal CMPj. When the signals DA1 and DA2 are both at a low level, the transmission gate 60 and the transistor 61 are turned on, so that a low level voltage is provided as the signal CMPj.

When the signal DA1 is at a low level and the signal DA2 is at a high level, only the transistor 61 is turned on, so that the high level signal CMPj is provided. On the contrary, when the signal DA1 is at a high level and the signal DA2 is at a low level, the transmission gate 60 and the transistor 62 are turned on, so that the high level signal CMPj is provided.

Consequently, the comparing circuit 6j provides the low level signal CMPj when a coincidence of the input bit signals DA1 and DA2 is detected, and provides the high level signal CMPj when it is not detected. The comparing circuit 6 shown in FIG. 1 includes eight circuits 6j shown in FIG. 11, each comparing two read data having 8 bits. Signals CMP1-CMP8 indicating the result of the comparison is provided via the output buffer 10 to the external, which enables the SRAM 200 to determine a short period whether any defect exists therein.

As can be seen from the foregoing, in the SRAM 200 shown in FIG. 1, a maximum of 16 defect addresses indicating a location of defective memory cell columns are programmed in the address programming circuit 3. Since there are eight memory cell columns in this embodiment which can be accessed by a defect address (eight sense amplifiers not shown operate simultaneously), a designation of a column in which a defect exists is carried out by programming in the I/O programming circuit 4.

When a column address which coincides with the programmed defect address is externally applied, the address programming circuit 3 applies an address coincidence detecting signal (one of the signals CO1–CO16) to the I/O programming circuit 4 and the switching circuit 13. The switching circuit 13 applies to a sense amplifier circuit a read data from a redundant memory cell column designated by the address coincidence detecting signal in the redundant memory cell array 1. The read data from the redundant memory cell array is applied to the selector circuit 5a and 5b.

The I/O programming circuit 4 responds to the address coincidence detecting signal applied from the address programming circuit 3 to generate the switching control signals S11–S18 and S21–S28 according to a program therein. The signals S11–S18 and S21–S28 are applied to the selector circuits 5a and 5b respectively in response to the group selecting signals GS1 and GS2. By selective switching in the selector circuits 5a and 5b, the read data from the designated redundant memory cell column is provided selectively in place of the read data from the defective memory cell array.

In a test mode, the comparing circuit 6 detects a coincidence between two data applied from the selector circuits 5a and 5b, each having 8 bit, so that a defect which remains in the memory cell array can be detected in a short period.

The SRAM 200 shown in FIG. 1 includes a total of 64 blocks, that is 64 memory cell arrays. Although each memory cell array does not contain any spare memory cell column or row, the redundant memory cell array 1 containing 16 redundant memory cell columns is provided, which enables a defect in the SRAM 200 to be sufficiently repaired. Since a spare memory cell column or row is not necessary for each memory cell array, it is pointed out that high integration can be accomplished.

In addition, if more than two defects exists in a memory cell array, it is also pointed out that these defects can be repaired by the redundant memory cell array 1. Further, even in the case the number of memory cell columns and rows which can be accessed by a column address or row address is increased as necessary, enlargement of the redundant memory cell array is not necessary, which means that modification of a design can be carried out easily. Still further, since a spare memory cell column or row is not provided for each memory cell array, length of a data bus is shortened so that high speed access can be accomplished.

In the above embodiment, this invention has been explained with respect to an example applied to an SRAM, while this invention is pointed out to be generally applied to a semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a plurality of memory cell array groups each including at least one memory cell array, said memory cell array including memory cells arranged in rows and columns;
    a single redundant memory cell array block provided in common for all of said memory cell arrays, for replacing an arbitrary defect column in all the memory cell arrays included in said plurality of memory cell array groups, said redundant memory cell array block including redundant memory cells arranged in rows and columns;
    defect address storage means for storing a defect address signal indicating a defective portion in said memory cell array;
    address coincidence detecting means for detecting a coincidence of an externally applied address signal and the defect address signal stored in said defect address storage means;
    redundant access means responsive to said address coincidence detecting means for accessing said redundant memory cell array block in place of said memory cell array including said defective portion;
    test mode detecting means for detecting a designation of an external test mode; and
    coincidence/non-coincidence detecting means responsive to test mode detecting means for reading data from a memory cell array in said plurality of memory cell array groups to detect a coincidence/non-coincidence of the read data,
    wherein, when a defect column exists in a memory cell array included in any of said plurality of memory cell groups, said coincidence/non-coincidence detecting means reads data from a corresponding column to be replaced in said redundant memory cell array, instead of reading data from the defect column in the group including the defect column.

2. The semiconductor memory device according to claim 1, wherein
    said defect address storage means includes a plurality of defect address programming means for programming a plurality of defect address signals indicating a plurality of defective portions in a memory cell array included in said plurality of memory cell array groups, and
    said address coincidence detecting means includes a plurality of programmed address coincidence detecting means for detecting a coincidence of said externally applied address signal and an address signal programmed in said plurality of defect address programming means.

3. The semiconductor memory device according to claim 2, wherein
    said redundant memory cell array block includes a plurality of redundant memory cell areas, each corresponding to one of said plurality of programmed address coincidence detecting means, and
    said redundant access means accesses a corresponding one of said plurality of redundant memory cell areas in response to a corresponding one of said plurality of programmed address coincidence detecting means.

4. The semiconductor memory device according to claim 1, wherein
    said redundant access means includes data selecting means for providing data read from said redundant memory cell array block in place of data read from said plurality of memory cell arrays, in response to said address coincidence detecting means.

5. The semiconductor memory device according to claim 4, wherein
said redundant access means further includes
row selecting means responsive to an externally applied row address signal for selecting a row to be accessed in said redundant memory cell array, and
column selecting means responsive to said address coincidence detecting means for selecting a column to be accessed in said redundant memory cell array.

6. The semiconductor memory device according to claim 4, wherein
said redundant access means further includes sense amplifier means coupled between said redundant memory cell array block and said data selecting means for amplifying data read from said redundant memory cell array.

7. The semiconductor memory device according to claim 3, wherein
said plurality of redundant memory cell areas include a plurality of redundant memory cell columns provided in said redundant memory cell array block.

8. The semiconductor memory device according to claim 1, wherein
said memory device includes a static random access memory.

9. A semiconductor memory device, comprising:
a first memory cell array group including at least one memory cell array;
a second memory cell array group including at least one memory cell array;
each memory cell array included in said first and second memory cell array groups including memory cells arranged in rows and columns;
a single redundant memory cell array block provided in common for said first and second memory cell array groups, for replacing an arbitrary defect column in all the memory cell arrays included in said first and second memory cell array groups,
said redundant memory cell array block including redundant memory cells arranged in rows and columns;
defect address storage means for storing a defect address signal indicating a defect column in said memory cell array;
address coincidence defecting means for defecting a coincidence of an externally applied address signal and the defect address signal stored in said defect address storage means;
redundant access means responsive to said address coincidence defecting means for accessing said redundant memory cell array block in place of said memory cell array including said defective column;
test mode detecting means for detecting a designation of an external test mode; and
coincidence/non-coincidence detecting means responsive to said test mode detecting means for detecting a coincidence/non-coincidence of data read from a memory cell array of said first memory cell array group and data read from a memory cell array of said second memory cell array group, wherein, when a defect column exists in a memory cell array included in either of said first and second memory cell array group, said coincidence/non-coincidence detecting means reads data from a corresponding column to be replaced in said redundant memory cell array, instead of reading data from the defect column in the memory cell array group including the defect column.

10. The semiconductor memory device according to claim 9, wherein,
said defect address storage means includes a plurality of defect address programming means for programming a plurality of defect address signals indicating a plurality of defective portions in a memory cell array included in said first and second memory cell array groups, and
said address coincidence detecting means includes a plurality of programmed address coincidence detecting means for detecting a coincidence of said externally applied address signal and an address signal programmed in said plurality of defect address programming means.

11. The semiconductor memory device according to claim 10, wherein
said redundant memory cell array block includes a plurality of redundant memory cell areas, each corresponding to one of said plurality of programmed address coincidence detecting means, and
said redundant access means accesses a corresponding one of said plurality of redundant memory cell areas in response to a corresponding one of said plurality of programmed address coincidence detecting means.

12. The semiconductor memory device according to claim 9, wherein
said redundant access means includes data selecting means for providing data read from said redundant memory cell array block in place of data read from said plurality of memory cell arrays in response to said address coincidence detecting means.

13. The semiconductor memory device according to claim 12, wherein
said redundant access means further includes
row selecting means responsive to an externally applied row address signal for selecting a row to be accessed in said redundant memory cell array, and
column selecting means responsive to said address coincidence detecting means for selecting a column to be accessed in said redundant memory cell array.

14. The semiconductor memory device according to claim 12, wherein
said redundant access means further includes
sense amplifier means coupled between said redundant memory cell array block and said data selecting means, for amplifying data read from said redundant memory cell array.

15. The semiconductor memory device according to claim 11, wherein
said plurality of redundant memory cell areas include a plurality of redundant memory cell columns provided in said redundant memory cell array block.

16. The semiconductor memory device according to claim 9, wherein
said memory device includes a static random access memory.

17. The semiconductor memory device according to claim 9, wherein said coincidence/non-coincidence detecting means includes
first selecting means responsive to said address coincidence detecting means for selectively providing
(i) multi-bit data read from said first memory cell array block, or
(ii) multi-bit data including a plurality of bits except one bit corresponding to a defect column in the multi-bit data from said first block, and one bit from said redundant memory cell array block,
second selecting means responsive to said address coincidence detecting means for selectively providing
(i) multi-bit data read from said second memory cell array block, or
(ii) multi-bit data including a plurality of bits except one bit corresponding to a defect column in the multi-bit data from said second block, and one bit from said redundant memory cell array block, and
coincidence/non-coincidence detecting means for defecting a coincidence/non-coincidence of respective selected data from said first and second selecting means.

18. A semiconductor memory device, comprising:
a plurality of memory cell array groups each including at least one memory cell array,
said memory cell array including memory cells arranged in rows and columns;
a plurality of data reading line groups provided correspondingly to said plurality of memory cell array groups,
each group including a plurality of data reading lines for transferring multi-bit data from a memory cell array included in a corresponding memory cell array group;
a single redundant memory cell array block provided in common for all of said memory cell arrays, for replacing an arbitrary defect column in all the memory cell arrays included in said plurality of memory cell array groups,
said redundant memory cell array block including redundant memory cells arranged in rows and columns;
a redundancy data reading line connected to said redundant memory cell array block for transferring one-bit data from the redundant memory cell array;
defect address storage means for storing a defect address signal indicating a defective portion in said memory cell array;
address coincidence detecting means for detecting a coincidence of an externally applied address signal and the defect address signal stored in said defect address storage means;
redundant access means responsive to said address coincidence detecting means for accessing said redundant memory cell array in place of said memory cell array including said defective portion;
test mode detecting means for detecting a designation of an external test mode; and
coincidence/non-coincidence detecting means responsive to said test mode detecting means for reading multi-bit data through corresponding data reading lines from memory cell arrays in all of said memory cell array groups, respectively, to detect a coincidence/non-coincidence of the read data from respective memory cell array groups,
when a defect column exists in a memory cell array included in any of said plurality of memory cell array groups, said coincidence/non-coincidence detecting means reading data from a corresponding column to be replaced in said redundant memory cell array through said redundancy reading line, instead of reading data from the defect column in the memory cell array group including the defect column.

19. A semiconductor memory device, comprising:
a first memory cell array group including at least one memory cell array;
a second memory cell array group including at least one memory cell array,
each memory cell array included in said first and second memory cell array groups including memory cells arranged in rows and columns;
a plurality of first data reading lines provided correspondingly to said first memory cell array group, for transferring multi-bit data from a memory cell array included in the first memory cell array group;
a plurality of second data reading lines provided correspondingly to said second memory cell array group, for transferring multi-bit data from a memory cell array included in the second memory cell array group;
a single redundant memory cell array block provided in common for said first and second memory cell array groups, for replacing an arbitrary defect column in all the memory cell arrays included in said first and second memory cell array groups,
said redundant memory cell array block including redundant memory cells arranged in rows and columns;
a redundancy data reading line connected to said redundant memory cell array block for transferring one-bit data from the redundant memory cell array;
defect address storage means for storing a defect address signal indicating a defective portion in said memory cell array;
address coincidence detecting means for detecting a coincidence of an externally applied address signal and the defect address signal stored in said defect address storage means;
redundant access means responsive to said address coincidence defecting means for accessing said redundant memory cell array in place of said memory cell array including said defective portion;
test mode detecting means for detecting a designation of an external test mode; and
coincidence/non-coincidence detecting means responsive to said test mode detecting means, for detecting a coincidence/non-coincidence of multi-bit data read from a memory cell array of said first memory cell group through said first data reading lines, and multi-bit data reading from a memory cell array of said second memory cell array group through said second data reading lines,
when a defect column exists in a memory cell array included in either of said first and second memory cell array groups, said coincidence/non-coincidence detecting means reading one-bit data from a corresponding column to be replaced in said redundant memory cell array through said redundancy reading line, instead of reading one-bit data from a defect column of the memory cell array group including the defect column.

20. A semiconductor memory device, comprising:
a first memory cell array group including at least one memory cell array;
a second memory cell array group including at least one memory cell array,
each memory cell array included in said first and second memory cell array groups including memory cells arranged in rows and columns;
a plurality of first data reading lines corresponding to said first memory cell array group, for transferring multi-bit data from a memory cell array included in the first memory cell array group;
a plurality of second data reading lines provided corresponding to said second memory cell array group, for transferring multi-bit data from a memory cell array included in the second memory cell array group;
a single redundant memory cell array block provided in common for said first and second memory cell array groups, for replacing an arbitrary defect column in all the memory cell arrays included in said first and second memory cell array groups,
said redundant memory cell array block including redundant memory cells arranged in rows and columns;
a redundancy data reading line connected to said redundant memory cell array block for transferring one-bit data from the redundant memory cell array;
detect address storage means for storing a defect address signal indicating a defective portion in said memory cell array;
address coincidence detecting means for detecting a coincidence of an externally applied address signal and the defective address signal stored in said defect address storage means; and
redundant access means responsive to said address coincidence detecting means for accessing said redundant memory cell array in place of said memory cell array including said defective portion.

* * * * *